(12) United States Patent
Osaki et al.

(10) Patent No.: US 9,331,307 B2
(45) Date of Patent: May 3, 2016

(54) METHOD FOR MANUFACTURING ORGANIC EL DEVICE AND ORGANIC EL DEVICE

(71) Applicant: NITTO DENKO CORPORATION, Ibaraki-shi, Osaka (JP)

(72) Inventors: Yoshinori Osaki, Ibaraki (JP); Shigenori Morita, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 0 days.

(21) Appl. No.: 14/381,478

(22) PCT Filed: Feb. 28, 2013

(86) PCT No.: PCT/JP2013/055379
§ 371 (c)(1),
(2) Date: Aug. 27, 2014

(87) PCT Pub. No.: WO2013/129564
PCT Pub. Date: Sep. 6, 2013

(65) Prior Publication Data
US 2015/0123088 A1    May 7, 2015

(30) Foreign Application Priority Data

Feb. 28, 2012  (JP) ................................. 2012-041700
Feb. 8, 2013   (JP) ................................. 2013-023502

(51) Int. Cl.
*H01L 51/00* (2006.01)
*H01L 51/50* (2006.01)
(Continued)

(52) U.S. Cl.
CPC ........ *H01L 51/5259* (2013.01); *H01L 51/0096* (2013.01); *H01L 51/5012* (2013.01); *H01L 51/524* (2013.01); *H01L 51/529* (2013.01); *H01L 51/5225* (2013.01); *H01L 51/56* (2013.01)

(58) Field of Classification Search
CPC .............. H01L 51/5296; H01L 51/524; H01L 51/5287; H01L 51/5012; H01L 51/5259; H01L 51/5225

USPC .............. 257/40, 79, 98, 414, 431, E51.018, 257/E51.046; 438/46, 82, 99
See application file for complete search history.

(56) References Cited

U.S. PATENT DOCUMENTS

2003/0178937 A1    9/2003   Mishima
2010/0244073 A1*   9/2010   Ito et al. .......................... 257/98
(Continued)

FOREIGN PATENT DOCUMENTS

DE      102010003121 A   9/2011
EP      2 744 305 A1     6/2014
(Continued)

OTHER PUBLICATIONS

Notification Concerning Transmittal of International Preliminary Report on Patentability (Form PCT/IB/326) of International Application No. PCT/JP2013/055379 mailed Sep. 12, 2014 with Forms PCT/IB/373, PCT/IB/338 and PCT/ISA/237.
(Continued)

*Primary Examiner* — Jasmine Clark
(74) *Attorney, Agent, or Firm* — Westerman, Hattori, Daniels & Adrian, LLP

(57) ABSTRACT

Provided is a method for manufacturing an organic EL device which suppresses a deterioration in the light emission properties. In this method, while first and second electrode layers are prevented from being in contact with each other, an organic layer is allowed to protrude from the first electrode layer toward at least both outer sides in the longitudinal direction of a substrate. Further, the second electrode layer is allowed to protrude from the organic layer toward at least both outer sides in the longitudinal direction. Thereby, the first electrode layer, the organic layer, and the second electrode layer are formed so that both end edges of the organic layer in a longitudinal direction of the substrate are covered by both end sides of the second electrode layer in the longitudinal direction, on at least both outer sides of the light emitting part in the longitudinal direction.

4 Claims, 6 Drawing Sheets

(51) Int. Cl.
*H01L 51/40* (2006.01)
*H01L 51/52* (2006.01)
*H01L 51/56* (2006.01)

(56) References Cited

U.S. PATENT DOCUMENTS

| | | | |
|---|---|---|---|
| 2010/0258797 A1* | 10/2010 | Yamamoto | H01L 51/56 257/43 |
| 2011/0073848 A1* | 3/2011 | Takada et al. | 257/40 |
| 2011/0101401 A1 | 5/2011 | Aratani et al. | |
| 2011/0186822 A1* | 8/2011 | Adachi | 257/40 |
| 2012/0074398 A1 | 3/2012 | Fujita | |
| 2012/0132950 A1* | 5/2012 | Yamamuro et al. | 257/99 |
| 2013/0009199 A1 | 1/2013 | Ingle et al. | |
| 2013/0153936 A1* | 6/2013 | Nishiyama | H01L 51/0018 257/88 |
| 2013/0313537 A1 | 11/2013 | Aratani et al. | |

FOREIGN PATENT DOCUMENTS

| | | |
|---|---|---|
| JP | 2002-25763 A | 1/2002 |
| JP | 3942017 B2 | 7/2007 |
| JP | 2009301965 A | 12/2009 |
| WO | 2009/025286 A1 | 2/2009 |
| WO | 2011/001567 A1 | 1/2011 |
| WO | 2011/117073 A2 | 9/2011 |
| WO | 2013/024707 A1 | 2/2013 |

OTHER PUBLICATIONS

International Search Report dated Jun. 4, 2013 issued in corresponding application No. PCT/JP2013/055379.
Chinese Office Action dated Oct. 30, 2015 issued in counterpart Japanese patent application No. 201380011467.X (6 pages).
European Search Report dated Sep. 21, 2015 issued in counterpart EP patent application No. 13754199.1. (6 pages).

* cited by examiner

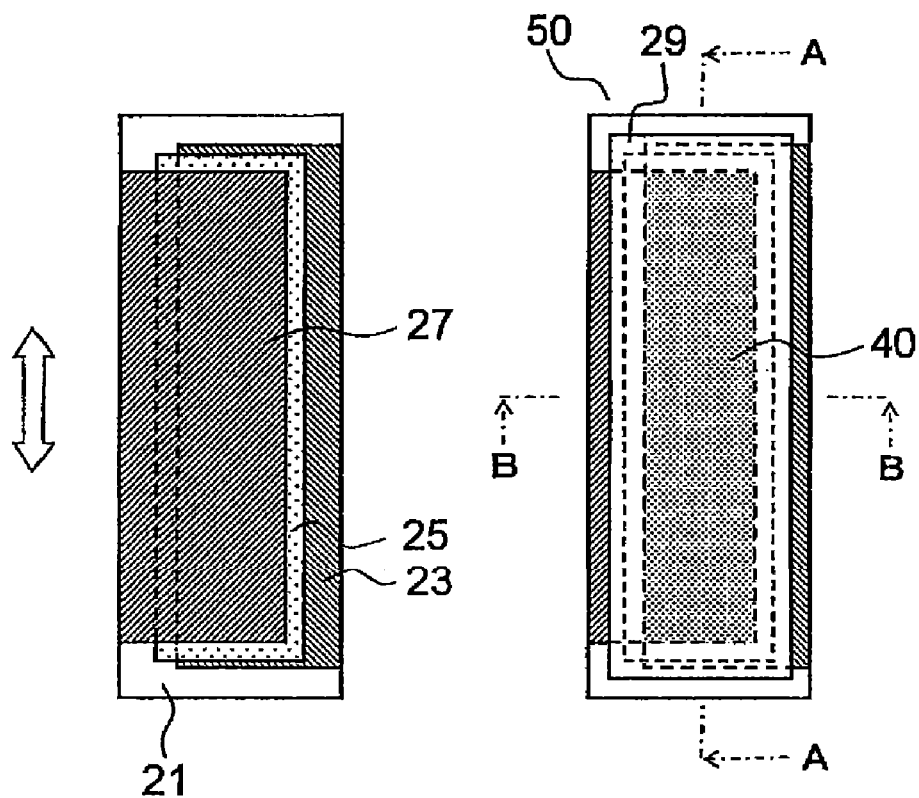
Fig. 10 (a)
Prior Art
Fig. 10 (b)
Prior Art
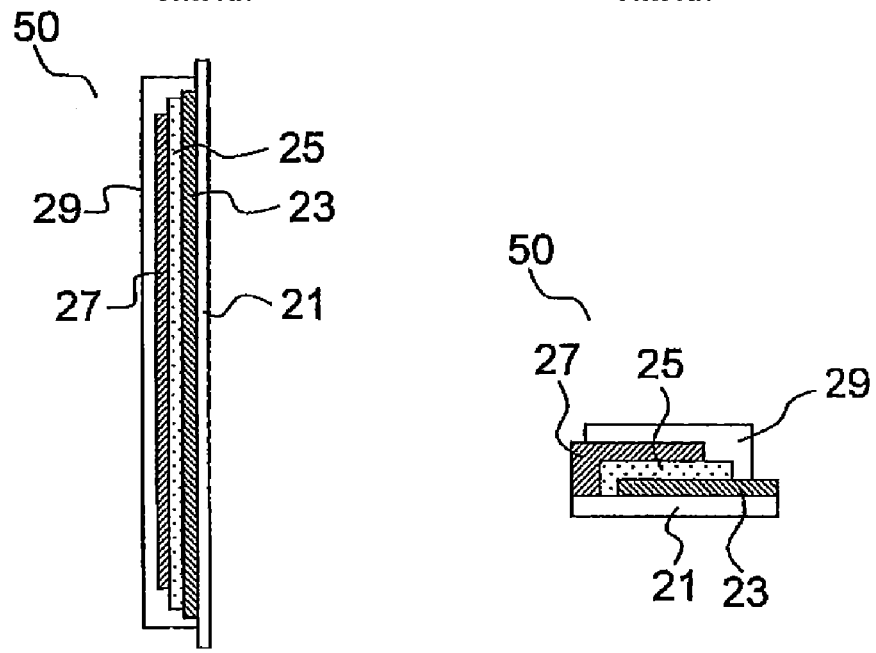
Fig. 10 (c)
Prior Art
Fig. 10 (d)
Prior Art

METHOD FOR MANUFACTURING ORGANIC EL DEVICE AND ORGANIC EL DEVICE

CROSS-REFERENCE TO RELATED APPLICATIONS

This application claims priority to Japanese Patent Applications Nos. 2012-041700 and 2013-023502, the disclosures of which are incorporated herein by reference in their entirety.

FIELD

The present invention relates to a method for manufacturing an organic EL device and an organic EL device, in which an electrode layer and an organic layer are formed on a substrate, and the organic layer is configured to emit light.

BACKGROUND

Conventionally, organic EL (electroluminescence) devices are known as devices to be used for light emitting displays, etc. Such an organic EL device basically has an organic layer having at least a light emitting layer as an organic constituent layer and a pair of electrode layers.

An example of the organic EL device is shown in FIG. 10. As shown in FIG. 10, a conventional organic EL device 50 is formed by sequentially stacking a first electrode layer 23 (for example, an anode layer), an organic layer 25 having at least a light emitting layer as an organic constituent layer, and a second electrode layer 27 (for example, a cathode layer) on one surface of a substrate 21 as constituent layers of the device (see FIG. 10(a)), and subsequently stacking a sealing layer 29 (see FIGS. 10(b) to (d)). Further, the organic EL device 50 has a portion in which the first electrode layer 23, the organic layer 25, and the second electrode layer 27 overlap and which serves as a light emitting part 40.

Furthermore, the first electrode layer 23 and the second electrode layer 27 are formed to protrude outwardly from the sealing layer 29 so as not to overlap each other, so that they can be energized from the outside with no short circuit therebetween.

For example, on the right side of FIG. 10(b), the right end side of the organic layer 25 protrudes from the right end edge of the second electrode layer 27 toward the right side so that the first electrode layer 23 can be energized with no short circuit, as described above. Further, the right end side of the first electrode layer 23 protrudes from the right end edge of the organic layer 25 toward the right side (see the right side of FIG. 10(a)). Furthermore, the right end side of the first electrode layer is formed to protrude from the right end edge of the sealing layer 29 toward the right side (see the right side of FIG. 10(d)).

Further, on the left side of FIG. 10(b), the left end side of the organic layer 25 protrudes from the left end edge of the first electrode layer 23 toward the left side so that the second electrode layer 27 can be energized with no short circuit, as described above. Further, the left end side of the second electrode layer 27 protrudes from the left end edge of the organic layer 25 toward the left side (see the left side of FIG. 10(a)). Furthermore, the second electrode layer 27 is formed to protrude from the left end edge of the sealing layer 29 toward the left side (see the left side of FIG. 10(d)).

In such an organic EL device of this type, a substrate made of an organic resin is used as a substrate for flexibility. In this case, there are cases where oxygen or moisture permeates through the substrate so as to penetrate into the above described constituent layer side, thereby causing a deterioration in light emission properties of the organic EL device over time.

Therefore, it has been proposed that oxygen or moisture is prevented from permeating through the substrate by using a substrate made of metal (see Patent Literatures 1 and 2). Further, in the case of using such a substrate made of metal, an insulating layer is formed on the substrate in order to prevent a short circuit due to contact between the substrate made of metal and the aforementioned first electrode layer.

CITATION LIST

Patent Literature

Patent Literature 1: JP 2002-025763 A
Patent Literature 2: JP 3942017 B2

SUMMARY

Technical Problem

However, even in the case of forming such an insulating layer as above on the substrate made of metal, there are cases where oxygen or moisture penetrates at the boundary between the organic layer and the electrode layer from the end edge sides, thereby generating a region that does not emit light (dark frame) in the light emitting part over time, resulting in a deterioration in the light emission properties.

In view of such problems, it is an object of the present invention to provide a method for manufacturing an organic EL device and an organic EL device, in which the deterioration in the light emission properties is suppressed.

Solution to Problem

Diligent studies by the inventors to solve the aforementioned problems have revealed the following findings.

That is, a strip-shaped metal substrate is generally formed by rolling the substrate in the longitudinal direction. It has been found that a plurality of fine grooves extending in the longitudinal direction are formed on a surface of the substrate across the width direction by the rolling.

Further, also after the insulating layer is stacked on the substrate, grooves formed due to the grooves of the substrate are found to extend in the longitudinal direction on a surface of the insulating layer stacked on the substrate.

Therefore, when an organic EL device is formed using such a substrate, lands formed between the plurality of grooves on the surface of the insulating layer are in contact mainly with the sealing layer, on both outer sides of the light emitting part in the width direction of the substrate. It has been found that such contact makes it difficult for oxygen or moisture to penetrate into the inside of the sealing layer from the outside in the width direction, thereby making their influence on the deterioration in the light emission properties comparatively less.

In contrast, it has been revealed that, on both outer sides of the light emitting part in the longitudinal direction of the substrate, the influence on the deterioration in the light emission properties significantly differs depending on the formed pattern of the organic layer and the second electrode layer.

Specifically, on at least one of both outer sides of the light emitting part in the longitudinal direction, the second electrode layer does not protrude outwardly from the organic layer. In the case where both end edges of the organic layer are not covered by the second electrode layer (see FIG. 6 to FIG.

10), oxygen or moisture passes through the aforementioned grooves on the surface of the insulating layer so as to penetrate into the inside of the sealing layer. Furthermore, oxygen or moisture penetrates from the end edge sides into a region corresponding to the light emitting part, at the boundary between the organic layer and the first electrode layer, or the boundary between the organic layer and the second electrode layer. It has been found that this causes the deterioration in the light emission properties.

On the other hand, in the case where the second electrode layer protrudes from the organic layer, and both end edges of the organic layer are covered by both end sides of the second electrode layer, on both outer sides of the light emitting part in the longitudinal direction (see FIG. 2 to FIG. 5), even if oxygen or moisture passes through the grooves on the surface of the insulating layer so as to penetrate into the inside of the sealing layer, they can be suppressed from penetrating further inward by the second electrode layer. Therefore, it has been found that the reaching of oxygen or moisture to the boundary between the organic layer and the second electrode layer is made difficult, and the reaching of oxygen or moisture to the light emitting part is made difficult.

On the basis of such findings, the inventors have accomplished the present invention.

That is, a method for manufacturing an organic EL device according to the present invention includes: sequentially forming an insulating layer, a first electrode layer, an organic layer having at least a light emitting layer as an organic constituent layer, a second electrode layer, and a sealing layer, on one surface of a strip-shaped metal substrate; and thereby manufacturing the organic EL device having a portion in which the first electrode layer, the organic layer, and the second electrode layer overlap and which serves as a light emitting part. In this method, while the first electrode layer and the second electrode layer are prevented from being in contact with each other, the first electrode layer, the organic layer, and the second electrode layer are formed so that both end edges of the organic layer in a longitudinal direction of the substrate are covered by both end sides of the second electrode layer in the longitudinal direction, on at least both outer sides of the light emitting part in the longitudinal direction, by allowing the organic layer to protrude from the first electrode layer toward at least both outer sides of the substrate in the longitudinal direction of the substrate and further allowing the second electrode layer to protrude from the organic layer toward at least both outer sides of the substrate in the longitudinal direction.

Further, an organic EL device according to the present invention includes: an insulating layer; a first electrode layer; an organic layer having at least a light emitting layer as an organic constituent layer; a second electrode layer; and a sealing layer, which are sequentially formed on one surface of a strip-shaped metal substrate, the organic EL device having a portion in which the first electrode layer, the organic layer, and the second electrode layer overlap and which serves as a light emitting part. In the organic EL device, the first electrode layer and the second electrode layer are not in contact with each other, and both end edges of the organic layer in the longitudinal direction of the substrate are covered by both end sides of the second electrode layer in the longitudinal direction, on at least both outer sides of the light emitting part in the longitudinal direction of the substrate, with a configuration where the organic layer protrudes from the first electrode layer toward at least both outer sides in a longitudinal direction of the substrate, and the second electrode layer also protrudes from the organic layer toward at least both outer sides in the longitudinal direction.

Further, in the organic EL device and its manufacturing method according to the present invention, it is desirable that the substrate have a surface roughness in the longitudinal direction that is smaller than a surface roughness in the lateral direction.

BRIEF DESCRIPTION OF DRAWINGS

FIG. 1(a) is a view in the case of an organic layer having a single layer.

FIG. 1(b) is a view in the case of an organic layer having three layers.

FIG. 1(c) is a view in the case of an organic layer having five layers.

FIG. 10(a) is a schematic plan view schematically showing the state before a sealing layer is formed when manufacturing a conventional organic EL device.

FIG. 10(b) is a schematic plan view schematically showing the state where a sealing layer is formed.

FIG. 10(c) is a cross sectional view taken along the line A-A in FIG. 10(b), as seen in the direction of the arrows.

FIG. 10(d) is a cross sectional view taken along the line B-B in FIG. 10(b), as seen in the direction of the arrows.

DESCRIPTION OF EMBODIMENTS

Figure 1:
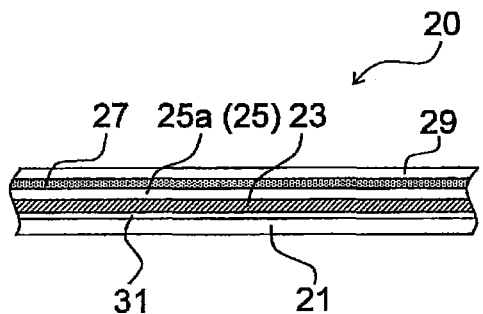
FIG. 1 depicts schematic partial side sectional views schematically showing examples of a layer configuration of an organic EL device.
Figure 1:
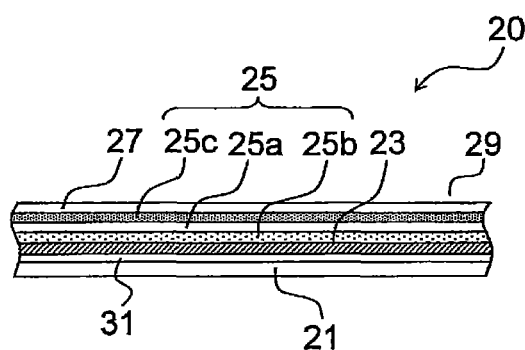
Figure 1:
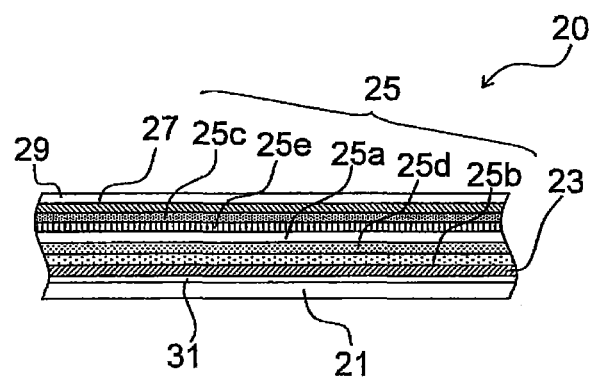

Hereinafter, a method for manufacturing an organic EL device and an organic EL device according to the present invention are described with reference to the drawings.

As shown in FIG. 1(a) the method for manufacturing an organic EL device according to this embodiment, an insulating layer 31, a first electrode layer (which herein is an anode layer) 23, an organic layer 25 having at least a light emitting layer 25a as an organic constituent layer, a second electrode layer 27 (which herein is a cathode layer), and a sealing layer 29 are sequentially formed on one surface of a strip-shaped metal substrate 21. Thus, an organic EL device 20 having a portion in which the anode layer 23, the organic layer 25, and the cathode layer 27 overlap and which serves as a light emitting part 40 is manufactured. Further, in the method for manufacturing an organic EL device, while the anode layer 23 and the cathode layer 27 are prevented from being in contact with each other, the organic layer 25 is allowed to protrude from the anode layer 23 toward at least both outer sides in the longitudinal direction of the substrate 21. Further, in the method for manufacturing an organic EL device, the cathode layer 27 is allowed to protrude from the organic layer 25 toward at least both outer sides thereof in the longitudinal direction. Thereby, the anode layer 23, the organic layer 25, and the cathode layer 27 are formed so that both end edges of the organic layer 25 in the longitudinal direction are covered by both end sides of the cathode layer 27 in the longitudinal direction, on at least both outer sides of the light emitting part 40 in the longitudinal direction of the substrate 21.

As a metal material for the substrate 21, any metal can be used as long as it is formable into a strip-shaped sheet by rolling at room temperature and normal pressure, such as stainless steel, Fe, Al, Ni, Co, and Cu, and alloys thereof.

As the insulating layer 31, an organic insulating layer or an inorganic insulating layer can be used, for example.

As a material for forming the organic insulating layer, an insulating resin can be used. Since the substrate 21 may be heated to 150 to 300° C. in the manufacturing process of the organic EL device in some cases, it is preferable to use a heat resistant resin having a glass transition temperature of 150° C. or more as a material for the organic insulating layer. Specific examples of the heat resistant resin include acrylic resin, norbornene resin, epoxy resin, polyimide resin, polyamide-imide resin, polyamide resin, polyester resin, polyarylate resin, polyurethane resin, polycarbonate resin, polyether ketone resin, and polyphenylsulfone resin, and resin composites thereof. Among these, it is preferable that the heat resistant resin be at least one selected from the group consisting of acrylic resin, norbornene resin, epoxy resin, and polyimide resin.

When the organic insulating layer has an excessively small thickness, the surface roughness of the metal substrate 21 cannot be sufficiently flattened in some cases. When it has an excessively large thickness, the adhesion to the metal substrate 21 may be reduced in some cases. From such viewpoints, the thickness of the organic insulating layer is preferably in the range of 1 to 40 μm. When the thickness is within this range, it is possible to ensure not only sufficient electrical insulating properties but also sufficient adhesion to the substrate 21. The thickness of the organic insulating layer is more preferably 0.5 to 10 μm, further preferably 1 to 5 μm. The method for forming the organic insulating layer on the substrate 21 is not specifically limited, and the organic insulating layer can be formed, for example, by coating such as roller coating, spraying coating, spin coating, and dipping, or by transferring resin in the form of a film.

As a material for forming the inorganic insulating layer, an inorganic material having insulating properties can be used. Further, it is preferable that the inorganic material have gas barrier properties. It is preferable that the inorganic material contain at least one of metal and semimetal, for example. Further, it is preferable that the at least one of metal and semimetal be at least one selected from the group consisting of oxide, nitride, carbide, oxynitride, oxycarbide, nitride carbide, and oxynitride carbide. Examples of the metal include zinc, aluminum, titanium, copper, and magnesium. Examples of the semimetal include silicon, bismuth, and germanium.

When the inorganic insulating layer has an excessively small thickness, the insulating properties decrease. Meanwhile, when the inorganic insulating layer has an excessively large thickness, cracks tend to occur, and gas barrier properties and insulating properties decrease. The thickness of the inorganic insulating layer is preferably in the range of 10 nm to 5 μm, more preferably in the range of 50 nm to 2 μm, further preferably in the range of 0.1 to 1 μm. The method for forming the inorganic insulating layer is not specifically limited, and dry methods, such as vapor deposition using an evaporation source capable of discharging an inorganic insulating layer-forming material, sputtering, and CVD, and wet methods such as a sol-gel method can be used.

As a material for forming the anode layer 23 (anode layer-forming material), indium-tin oxide (ITO) and zinc oxide materials such as indium-zinc oxide (IZO), zinc oxide (ZnO), gallium doping zinc oxide (GZO), and antimony doping zinc oxide (AZO) can be used.

The method for forming the anode layer 23 on the insulating layer 31 is not specifically limited, and common vapor deposition using an evaporation source capable of discharging an anode layer-forming material can be used, for example. In such vapor deposition, it is preferable to use thermal deposition.

The organic layer 25 has at least the light emitting layer 25a as an organic constituent layer. The organic layer 25 is composed of a single organic constituent layer, or a stack of a plurality of organic constituent layers. In the case where the organic layer 25 is composed of a single organic constituent layer, the organic constituent layer is the above described light emitting layer 25a. In the case where the organic layer is composed of a plurality of organic constituent layers, the plurality of organic constituent layers are composed of the light emitting layer 25a and organic constituent layers other than the light emitting layer 25a. Further, examples of the organic constituent layers other than the light emitting layer 25a include a hole injection layer 25b, a hole transporting layer 25d, an electron injection layer 25c, and an electron transporting layer 25e.

In this way, the organic layer 25 is not specifically limited as long as it has at least the light emitting layer 25a as its organic constituent layer. The organic layer 25 can be formed by stacking a plurality of organic constituent layers, as needed. For example, as shown in FIG. 1(b), the organic layer may be formed as a three-layered stack by stacking the hole injection layer 25b, the light emitting layer 25a, and the electron injection layer 25c in this order. Other than that, the organic layer may be formed as a four-layered stack by interposing the hole transporting layer 25d between the light emitting layer 25a and the hole injection layer 25b shown above in FIG. 1(b) (see FIG. 1(c)), or by interposing the electron transporting layer 25e between the light emitting layer 25a and the electron injection layer 25c (see FIG. 1(c)), as needed.

Furthermore, as shown in FIG. 1(c), the organic layer may be formed as a five-layered stack by interposing the hole transporting layer 25d between the hole injection layer 25b and the light emitting layer 25a, and interposing the electron transporting layer 25e between the light emitting layer 25a and the electron injection layer 25c. Further, the film thickness of each layer is generally designed to be about several nm to several tens of nm. However, such film thickness is appropriately designed corresponding to an organic layer-forming material, the light emission properties, or the like, and thus is not specifically limited.

Examples of a material for forming the light emitting layer 25a include tris-(8-quinolinol) aluminum (Alq3), and [2-tert-butyl-6-[2-(2,3,6,7-tetrahydro-1,1,7,7-tetramethyl-1H,5H-benzo[ij]quinolizin-9-yl)vinyl]-4H-pyran-4-ylidene]malononitrile (DCJTB).

The hole injection layer 25b is a layer that facilitates the injection of holes from the anode layer 23 into the light emitting layer 25a or the hole transporting layer 25d. Examples of a material for forming the hole injection layer 2b include HAT-CN (1,4,5,8,9,12-hexaazatriphenylene hexacarbonitrile), copper phthalocyanine (CuPc), and N,N'-di(1-naphthyl)-N,N'-diphenyl-1,1'-biphenyl-4,4'-diamine (α-NPD).

The hole transporting layer 25d is a layer that has at least one of a function to transport holes and a function to suppress the migration of electrons injected from the cathode layer 27 to the anode layer 23. Examples of a material for forming the hole transporting layer 25d include N,N'-bis(naphthalene-1-yl)-N,N'-bis(phenyl)-benzidine (NPB), N,N'-di(1-naphthyl)-N,N'-diphenyl-1,1'-biphenyl-4,4'-diamine (α-NPD), N,N,N',N'-tetraphenyl-4,4'-diaminophenyl, and N,N'-diphenyl-N,N'-bis(3-methylphenyl)-[1,1'-biphenyl]-4,4'-diamine (TPD).

The electron injection layer 25c is a layer that facilitates the injection of electrons from the cathode layer 27 into the light emitting layer 25a or the electron transporting layer 25e. Examples of a material for forming the electron injection layer 25c include lithium fluoride (LiF) and cesium fluoride (CsF).

The electron transporting layer 25e is a layer that has at least one of a function to transport electrons and a function to suppress the migration of holes injected from the anode layer 23 to the cathode layer 27. Examples of a material for forming the electron transporting layer 25e include tris-(8-quinolinol) aluminum (Alq3).

The method for forming the organic layer 25 on the anode layer 23 is not specifically limited, and common vapor deposition using an evaporation source capable of discharging an organic layer-forming material can be used, for example. In such vapor deposition, it is preferable to use thermal deposition.

Examples of a material for forming the cathode layer 27 (cathode layer-forming material) include aluminum (AD, magnesium silver (Mg/Ag), ITO, and IZO.

The method for forming the cathode layer 27 on the organic layer 25 is not specifically limited, and vapor deposition using an evaporation source capable of discharging a cathode layer-forming material can be used, for example. In addition, a film forming method by sputtering also can be used, for example.

Examples of a material for forming the sealing layer 29 (sealing layer-forming material) include SiOCN, SiN, and SiON.

The method for forming the sealing layer 29 on the cathode layer 27 is also not specifically limited, and vapor deposition using an evaporation source capable of discharging a sealing layer-forming material can be used, for example. In such vapor deposition, it is preferable to use plasma assisted deposition, for example.

In the method for manufacturing an organic EL device of this embodiment, a stack of the substrate 21 and the insulating layer 31 formed on one surface of the substrate 21 is formed in advance, and the anode layer 23, the light emitting layer 25a, the cathode layer 27, and the sealing layer 29 are sequentially deposited on the insulating layer 31 of the stack. Other than that, the insulating layer 31 may be formed, using an evaporation source for forming the insulating layer 31, on the substrate 21 on which the insulating layer 31 is not stacked in advance, and the anode layer 23, the light emitting layer 25a, the cathode layer 27, and the sealing layer 29 may be sequentially formed on the thus formed insulating layer 31, as described above.

Specifically, in the method for manufacturing an organic EL device of this embodiment, the insulating layer 31 is first applied onto one surface of the substrate 21 in advance, for example, using a coating apparatus.

Next, the anode layer 23 is formed on the insulating layer 31 of the stack of the substrate 21 and the insulating layer 31 using vapor deposition described above. Subsequently, the light emitting layer 25a that is an organic layer is formed on the anode layer 23 using vapor deposition described above. Further, the cathode layer 27 is formed on the light emitting layer 25a using vapor deposition described above. Then, the sealing layer 29 is formed from above the cathode layer 27 so as to cover the thus formed layers using vapor deposition described above. Thus, the organic EL device 20 is formed.

Subsequently, the formation of each layer is described.

The anode layer 23, the organic layer 25, the cathode layer 27, and the sealing layer 29 can be appropriately patterned, for example, by using a conventionally known method, such as a method of allowing each of the constituent layer-forming materials to pass through a shadow mask provided with an opening of a desired shape and interposed between the substrate 21 and each of the evaporation sources described above. Further, examples of the pattern of the constituent layers include the patterns shown in FIG. 2 and FIG. 4. However, there is no specific limitation to these patterns shown in FIG. 2 and FIG. 4.

For example, as shown in FIG. 1, while the anode layer 23 and the cathode layer 27 are prevented from being in contact with each other, the anode layer 23 is first formed on the insulating layer 31 of the aforementioned stack (see FIG. 2(a)). Next, the organic layer 25 is formed so as to cover the anode layer 23 on at least both outer sides of the light emitting part 40 in the longitudinal direction (direction of the white arrow) of the substrate 21 (see FIG. 2(b)). Subsequently, the cathode layer 27 is formed so as to protrude from the organic layer 25 toward at least both outer sides and to cover both end edges of the organic layer 25 in the longitudinal direction, on both outer sides thereof (see FIG. 2(c)). Then, the sealing layer 29 is formed so that parts of the anode layer 23 and the cathode layer 27 protrude therefrom (FIG. 2(d)). Thus, the organic EL device 20 is formed, and the portion in which the anode layer 23, the organic layer 25, and the cathode layer 27 overlap serves as the light emitting part 40 (see FIG. 3).

Figure 2:
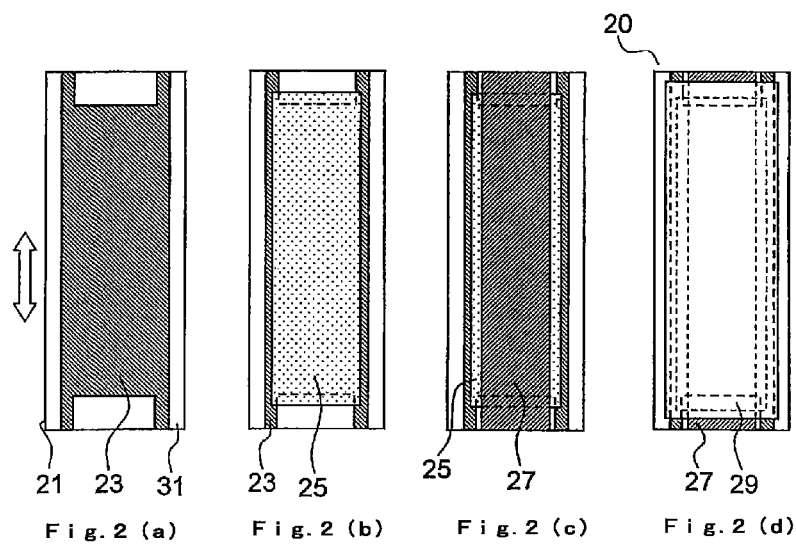
FIG. 2(a) is a schematic plan view schematically showing the state where an anode layer is formed when manufacturing an organic EL device of Example 1 and Example 3.
FIG. 2(b) is a schematic plan view schematically showing the state where an organic layer is formed.
FIG. 2(c) is a schematic plan view schematically showing the state where a cathode layer is formed.
FIG. 2(d) is a schematic plan view schematically showing the state where a sealing layer is formed.
Figure 3:
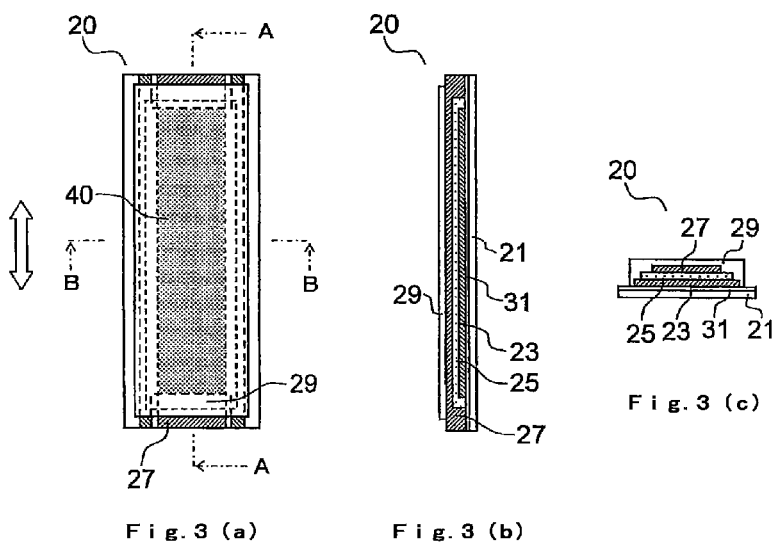
FIG. 3(a) is a schematic plan view schematically showing the organic EL device of Example 1 and Example 3.
FIG. 3(b) is a cross sectional view taken along the line A-A in FIG. 3(a), as seen in the direction of the arrows.
FIG. 3(c) is a cross sectional view taken along the line B-B in FIG. 3(a), as seen in the direction of the arrows.

Further, as shown in FIG. 2 and FIG. 3, both end edges of the organic layer 25 in the longitudinal direction are covered by both end sides of the cathode layer 27, on both outer sides of the light emitting part 40 in the longitudinal direction.

In FIG. 2 and FIG. 3 as described above, the organic layer 25 protrudes outwardly relative to the cathode layer 27, on both outer sides of the light emitting part 40 in the width direction of the substrate 21 (the left and right directions in FIG. 2 and FIG. 3). Further, the anode layer 23 protrudes outwardly relative to the organic layer 25. Furthermore, the anode layer 23 and the cathode layer 27 thus formed are not in contact with each other.

Figure 4:
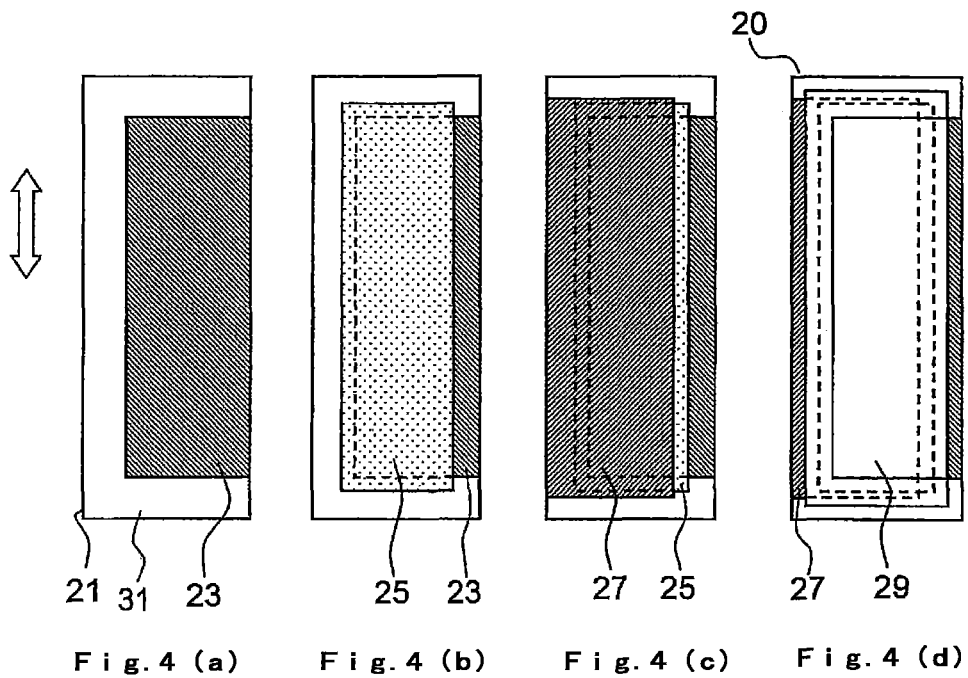
FIG. 4(a) is a schematic plan view schematically showing the state where an anode layer is formed when manufacturing an organic EL device of Example 2.
FIG. 4(b) is a schematic plan view schematically showing the state where an organic layer is formed.
FIG. 4(c) is a schematic plan view schematically showing the state where a cathode layer is formed.
FIG. 4(d) is a schematic plan view schematically showing the state where a sealing layer is formed.

Alternatively, for example, as shown in FIG. 4, while the anode layer 23 and the cathode layer 27 are prevented from being in contact with each other, the anode layer 23 is first formed on the insulating layer 31 of the aforementioned stack (see FIG. 4(a)). Next, the organic layer 25 is formed so as to cover the anode layer 23 on at least both outer sides of the light emitting part 40 in the longitudinal direction (direction of the white arrow) of the substrate 21 (see FIG. 4(b)). Subsequently, the cathode layer 27 is formed so as to protrude from the organic layer 25 toward at least both outer sides described above and to cover both end edges of the organic layer 25 in the longitudinal direction, on both outer sides described above (see FIG. 4(c)). Then, the sealing layer 29 is formed so that parts of the anode layer 23 and the cathode layer 27 protrude therefrom (see FIG. 4(d)). Thus, the organic EL device 20 is formed, and the portion in which the anode layer 23, the organic layer 25 and the cathode layer 27 overlap serves as the light emitting part 40 (see FIG. 5). Further, as shown in FIG. 4 and FIG. 5, both end edges of the organic layer 25 in the longitudinal direction are covered by both end sides of the cathode layer 27, on both outer sides of the light emitting part 40 in the longitudinal direction.

Figure 5:
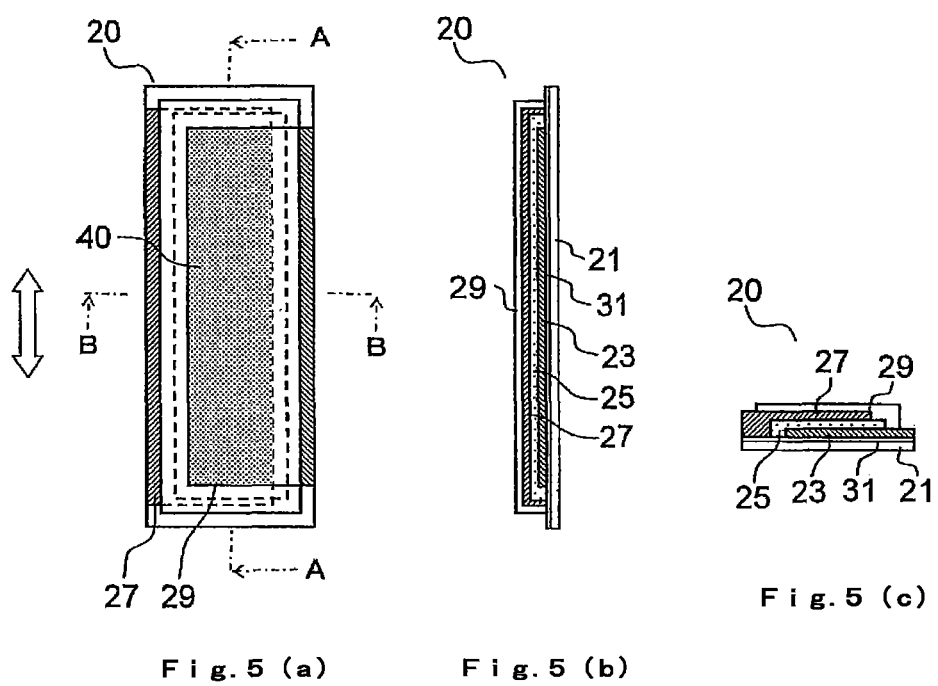
FIG. 5(a) is a schematic plan view schematically showing the organic EL device of Example 2.
FIG. 5(b) is a cross sectional view taken along the line A-A in FIG. 5(a), as seen in the direction of the arrows.
FIG. 5(c) is a cross sectional view taken along the line B-B in FIG. 5(a), as seen in the direction of the arrows.

In FIG. 4 and FIG. 5 as described above, the organic layer 25 protrudes outwardly from the cathode layer 27 on one outer side (the right side in FIG. 4 and FIG. 5) of both outer sides of the light emitting part 40 in the width direction of the substrate 21 (the left and right directions in FIG. 4 and FIG. 5). Further, the anode layer 23 protrudes outwardly from the organic layer 25. In contrast, on the other outer side (the left side in FIG. 4 and FIG. 5), the organic layer 25 protrudes outwardly from the anode layer 23. Further, the cathode layer 27 protrudes outwardly from the organic layer 25. Furthermore, the anode layer 23 and the cathode layer 27 thus formed are not in contact with each other.

In the organic EL device 20 exemplified in FIG. 3 and FIG. 5 above, the portions of the anode layer 23 and the cathode layer 27 protruding from the sealing layer 29 are not in contact with each other. By supplying electricity to such protruding portions, the light emitting part 40 is caused to emit light.

This embodiment employs a configuration in which the light emitting part 40 has a rectangular shape. However, the shape of the light emitting part 40 is not specifically limited.

According to the manufacturing method, the anode layer 23, the organic layer 25, and the cathode layer 27 can be formed, while the anode layer 23 and the cathode layer 27 are prevented from being in contact with each other. Therefore, light emission of the light emitting part 40 is enabled while the short circuit between the anode layer 23 and the cathode layer 27 is avoided. Further, both end edges of the organic layer 25 in the longitudinal direction of the strip-shaped metal substrate 21 are covered by both end sides of the cathode layer 27 in the longitudinal direction, on both outer sides of the light emitting part 40 in the longitudinal direction, thereby making it difficult for oxygen or moisture to reach the boundary between the organic layer 25 and the cathode layer 27, even if oxygen or moisture passes through the grooves on the surface of the insulating layer 31 that are formed due to the fine grooves extending along the longitudinal direction on the surface of the substrate 21 and thus penetrates into the inside of the sealing layer 29. Therefore, it is possible to suppress the penetration of oxygen or moisture into the inside of the light emitting part 40.

Accordingly, the organic EL device 20 in which the deterioration in the light emission properties is suppressed can be manufactured.

It should be noted that, in the organic EL device 20 exemplified in FIG. 2 to FIG. 5, both end edges of the organic layer 25 are not covered by both end sides of the cathode layer 27 on at least one of the outer sides of the light emitting part 40 in the width direction of the substrate 21. However, since the lands between the grooves formed on the surface of the insulating layer 31 are in contact with the aforementioned constituent layers in the width direction, as described above, the penetration of oxygen or moisture into the inside of the sealing layer 29 can be suppressed.

Further, the above described manufacturing method may be implemented, for example, as follows. A stack of the substrate 21 and the insulating layer 31 wound into a roll is unwound from a feed roller that is a feeding unit. While the substrate 21 of the thus unwound stack is abutted against a surface of a can roll (not shown) and is being conveyed, the anode layer 23, the organic layer 25, the cathode layer 27, and the sealing layer 29 are sequentially formed, as described above, on the insulating layer 31 of the stack supported by the can roll. The thus obtained organic EL device 20 is sequentially wound up on a take-up roller (not shown) that is a collecting unit.

In addition, the above described manufacturing method may be implemented, for example, as follows. The substrate 21 wound into a roll is unwound from the aforementioned feed roller. The insulating layer 31, the anode layer 23, the organic layer 25, the cathode layer 27, and the sealing layer 29 are sequentially formed, as described above, on the thus unwound substrate 21. The thus obtained organic EL device 20 is sequentially wound up on the aforementioned take-up roller.

Further, it is also possible to form the organic EL device 20 in the form of a sheet, for example, by unwinding the organic EL device 20 that is wound up on the take-up roller, as described above, and cutting it.

The organic EL device 20 of this embodiment obtained by the above described manufacturing method is formed by sequentially forming the insulating layer 31, the first electrode layer (which herein is the anode layer 23), the organic layer 25 having at least the light emitting layer 25a as an organic constituent layer, the second electrode layer (which herein is the cathode layer 27), and the sealing layer 29, on one surface of the strip-shaped metal substrate 21. Furthermore, the organic EL device 20 has a portion in which the anode layer 23, the organic layer 25, and the cathode layer 27 overlap and which serves as the light emitting part 40. The anode layer 23 and the cathode layer 27 are not in contact with each other. The organic layer 25 protrudes from the anode layer 23 toward at least both outer sides in the longitudinal direction of the substrate 21. Further, the cathode layer 27 protrudes from the organic layer 25 toward at least both outer sides in the longitudinal direction. Thereby, both end edges of the organic layer 25 in the longitudinal direction of the substrate 21 are covered by both end sides of the cathode layer 27 in the longitudinal direction, on at least both outer sides of the light emitting part 40 in the longitudinal direction.

The organic EL device 20 is configured to suppress the deterioration, as described above.

The method for manufacturing an organic EL device and the organic EL device of the present invention are as described above. However, the present invention is not limited to the aforementioned embodiments, and the design can be appropriately modified within the scope intended by the present invention.

Further, in the aforementioned embodiments, the first electrode layer is the anode layer 23, and the second electrode layer is the cathode layer 27. Other than that, it is also possible to form a cathode layer that serves as the first electrode layer, an organic layer, and an anode layer that serves as the second electrode layer, sequentially on the insulating layer 31 of the aforementioned stack.

EXAMPLES

Next, the present invention is described further in detail by way of examples. However, the present invention is not limited to these examples.

Measurement of Substrate Surface Roughness Ra

Substrate surface roughness (Ra) was measured using a stylus profilometer (product name: Dektak 150). The surface roughness of the substrate was measured at ten points each in the longitudinal direction and in the lateral direction of the substrate, and the average of values measured at the ten points was taken as the substrate surface roughness in the longitudinal direction and in the lateral direction.

Example 1

As a strip-shaped metal substrate, a rolled flexible SUS substrate having a width of 30 mm, a length of 140 m, a thickness of 50 μm, a substrate surface roughness (Ra) in the longitudinal direction of 40 nm, and a substrate surface roughness (Ra) in the lateral direction of 55 nm was used. That is, in Example 1, the substrate surface roughness in the longitudinal direction was smaller than the surface roughness in the lateral direction. An insulating layer having a thickness of 3 μm was formed on one surface of the substrate by applying acrylic resin (product name "JEM-477", manufactured by JSR Corporation) using a coating apparatus. Such a stack of the substrate and the insulating layer was wound around a feed roller (not shown). Further, as a pattern of a first electrode layer, an organic layer, a second electrode layer, and a sealing layer, the pattern shown in FIG. 2 was employed.

With the stack wound in a roll being continuously unwound from the feed roller, an Al layer (anode layer) having a thickness of 100 nm that serves as the first electrode layer 23, a HAT-CN (1,4,5,8,9,12-hexaazatriphenylene hexacarbonitrile) layer having a thickness of 10 nm that serves as a hole injection layer of the organic layer 25, an NPB layer having a thickness of 50 nm that serves as a hole transporting layer thereof, an Alq3 layer having a thickness of 45 nm that serves as a light emitting layer and an electron transporting layer thereof, and a LiF layer having a thickness of 0.5 nm that serves as an electron injection layer thereof were thermally deposited in this order on the insulating layer 31 of the thus unwound stack. Thereafter, a Mg/Ag layer (cathode layer) having a thickness of 5/15 nm was co-deposited as the second electrode layer 27. Further, an ITO layer (cathode layer) having a thickness of 50 nm was formed by sputtering. Thereafter, SiOCN having a thickness of 0.4 μm was deposited as the sealing layer 29 by plasma assisted deposition. The thus obtained stack (organic EL device 20) was wound up on a take-up roller.

After the completion of the winding, the aforementioned stack was unwound and was cut into a specific length. Thus, the organic EL device 20 of Example 1 (length: 80 mm×width: 30 mm) was obtained (see FIG. 3).

Example 2

The organic EL device 20 of Example 2 was produced in the same manner as in Example 1 except that the pattern shown in FIG. 4 was employed as a pattern of the first electrode layer 23, the organic layer 25, the second electrode layer 27, and the sealing layer 29 (see FIG. 5).

Example 3

A LiF layer having a thickness of 0.5 nm that serves as a hole injection layer of the organic layer, an Alq3 layer having a thickness of 45 nm that serves as a light emitting layer and an electron transporting layer thereof, NPB having a thickness of 50 nm that serves as a hole transporting layer thereof, and CuPc having a thickness of 10 nm that serves as an electron injection layer thereof were thermally deposited in this order. Further, an ITO layer (cathode layer) having a thickness of 50 nm was formed by sputtering as a second electrode layer. Thereafter, SiOCN having a thickness of 400 nm was deposited as a sealing layer by plasma assisted deposition. Except for these points, the same configuration as that of Example 1 was employed. Further, the pattern shown in FIG. 2 was employed. Thus, the organic EL device 20 of Example 3 (length: 80 mm×width: 30 mm) was obtained (see FIG. 3).

Comparative Example 1

Figure 6:
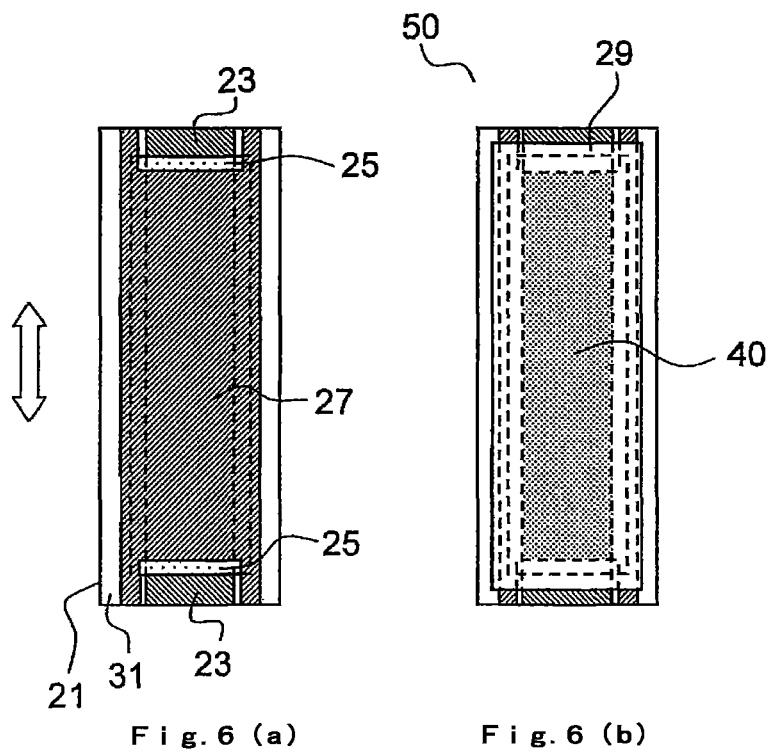
FIG. 6(a) is a schematic plan view schematically showing the state before a sealing layer is formed when manufacturing an organic EL device of Comparative Example 1 and Comparative Example 5.
FIG. 6(b) is a schematic plan view schematically showing the state where a sealing layer is formed.

The organic EL device 50 of Comparative Example 1 was produced in the same manner as in Example 1 except that the pattern shown in FIG. 6 was employed.

Comparative Example 2

Figure 7:
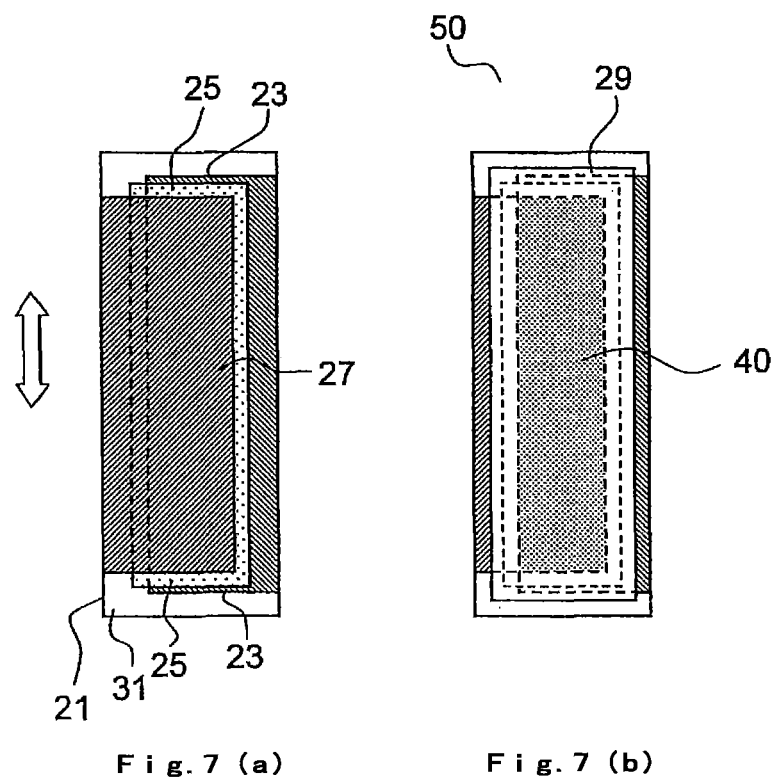
FIG. 7(a) is a schematic plan view schematically showing the state before a sealing layer is formed when manufacturing an organic EL device of Comparative Example 2.
FIG. 7(b) is a schematic plan view schematically showing the state where a sealing layer is formed.

The organic EL device 50 of Comparative Example 2 was produced in the same manner as in Example 1 except that the pattern shown in FIG. 7 was employed.

Comparative Example 3

Figure 8:
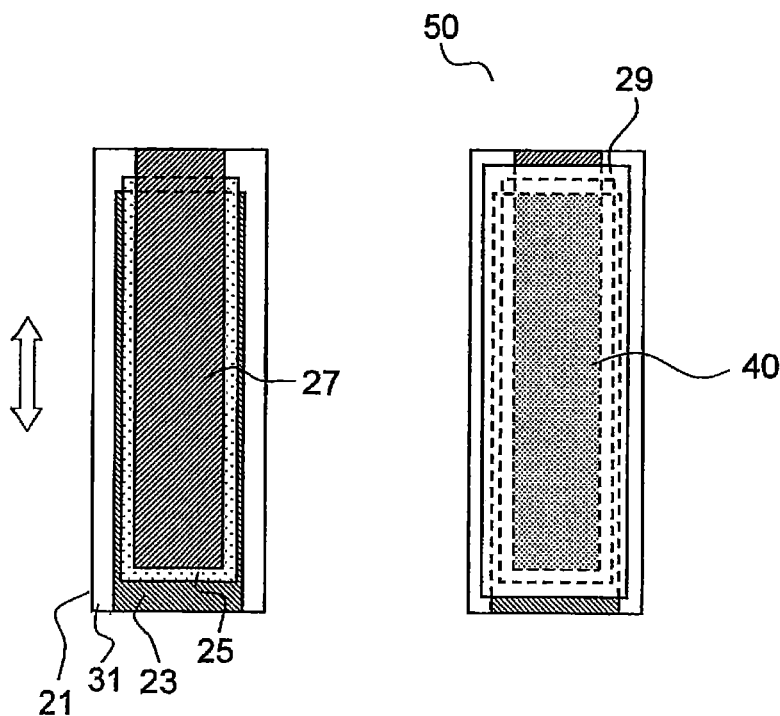
FIG. 8(a) is a schematic plan view schematically showing the state before a sealing layer is formed when manufacturing an organic EL device of Comparative Example 3.
FIG. 8(b) is a schematic plan view schematically showing the state where a sealing layer is formed.

The organic EL device 50 of Comparative Example 3 was produced in the same manner as in Example 1 except that the pattern shown in FIG. 8 was employed.

Comparative Example 4

Figure 9:
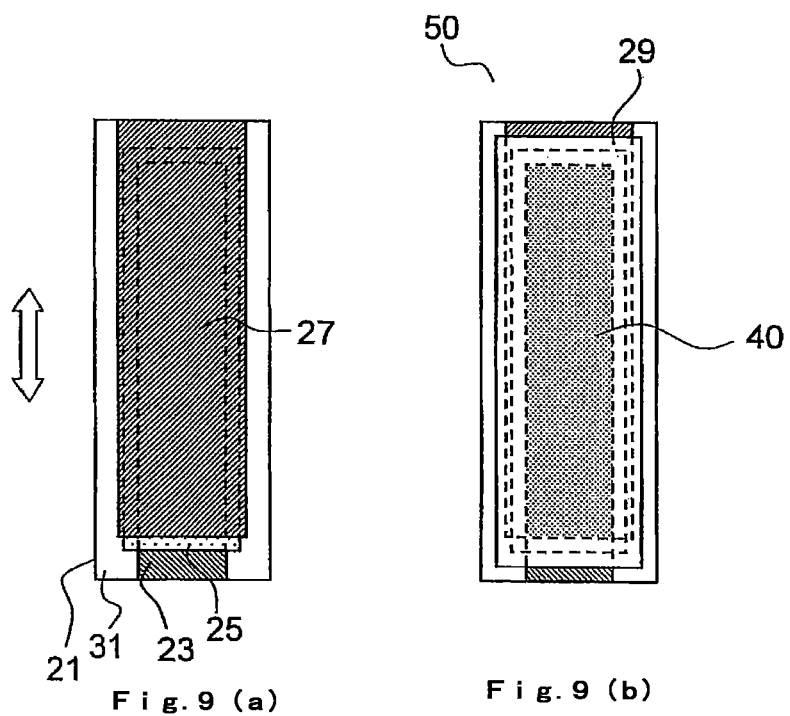
FIG. 9(a) is a schematic plan view schematically showing the state before a sealing layer is formed when manufacturing an organic EL device of Comparative Example 4.
FIG. 9(b) is a schematic plan view schematically showing the state where a sealing layer is formed.

The organic EL device 50 of Comparative Example 4 was produced in the same manner as in Example 1 except that the pattern shown in FIG. 9 was employed.

Comparative Example 5

The organic EL device 50 of Comparative Example 5 was produced in the same manner as in Example 3 except that the pattern shown in FIG. 6 was employed.

Evaluation of Lifetime of Organic EL Device

Each of the thus obtained organic EL devices emitting no light was stored in a thermo-hygrostat set to 60° C./90% RH. The organic EL device was taken out at every specific time point from the start of storage, and was caused to emit light. The area of the light emitting part (area of the region emitting light) was measured. The relationship between the storage time and the area of the light emitting part was plotted on a graph. Then, the time at which the area of the light emitting part started decreasing was taken as the lifetime of the organic EL device. The area of the light emitting part was measured using a digital microscope (product name: VHX-1000), manufactured by KEYENCE CORPORATION. Table 1 shows the results.

In Examples 1 to 3, both end edges of the organic layer were covered by both end sides of the second electrode layer (cathode layer), on both outer sides of the light emitting part in the longitudinal direction of the substrate. In Comparative Examples 1 to 5, at least one of both end edges of the organic layer was not covered by the cathode layer. As shown in Table 1, as a result of comparison of Examples 1 to 3 with Comparative Examples 1 to 5, the lifetime of Examples 1 to 3 was longer than the lifetime of Comparative Examples 1 to 5 by 1.5 times or more. These results revealed that the organic EL devices obtained by the manufacturing method of the present invention can suppress a deterioration in the light emission properties, and has excellent long-term stability.

It should be noted that, although an organic insulating layer was used as an insulating layer in the aforementioned examples, the effects of the present invention could be obtained in the same manner also in the case of using an inorganic insulating layer.

TABLE 1

|  | Lifetime (hr) |
|---|---|
| Ex. 1 | 660 |
| Ex. 2 | 680 |
| Ex. 3 | 640 |
| C. Ex. 1 | 350 |
| C. Ex. 2 | 390 |
| C. Ex. 3 | 370 |
| C. Ex. 4 | 370 |
| C. Ex. 5 | 340 |

REFERENCE SIGNS LIST

20: Organic EL Device
21: Substrate
23: Anode Layer (First Electrode Layer)
25: Organic Layer
25a: Light Emitting Layer (Organic Constituent Layer)
27: Cathode Layer (Second Electrode Layer)
29: Sealing Layer
40: Light Emitting Part

The invention claimed is:

1. A method for manufacturing an organic EL device, comprising:
sequentially forming an insulating layer, a first electrode layer, an organic layer having at least a light emitting layer as an organic constituent layer, a second electrode layer, and a sealing layer, on one surface of a strip-shaped metal substrate; and thereby
manufacturing the organic EL device having a portion in which the first electrode layer, the organic layer, and the second electrode layer overlap and which serves as a light emitting part, wherein
while the first electrode layer and the second electrode layer are prevented from being in contact with each other,
the first electrode layer, the organic layer, and the second electrode layer are formed so that both end edges of the organic layer in a longitudinal direction of the substrate are covered by both end sides of the second electrode layer in the longitudinal direction, on at least both outer sides of the light emitting part in the longitudinal direction of the substrate, by allowing the organic layer to protrude from the first electrode layer toward at least both outer sides of the substrate in the longitudinal direction and further allowing the second electrode layer to protrude from the organic layer toward at least both outer sides of the substrate in the longitudinal direction.

2. The method for manufacturing an organic EL device according to claim 1, wherein
the substrate has a surface roughness in the longitudinal direction that is smaller than a surface roughness in the lateral direction.

3. An organic EL device comprising:
an insulating layer; a first electrode layer; an organic layer having at least a light emitting layer as an organic constituent layer; a second electrode layer; and a sealing layer, which are sequentially formed on one surface of a strip-shaped metal substrate,
the organic EL device having a portion in which the first electrode layer, the organic layer, and the second electrode layer overlap and which serves as a light emitting part, wherein
the first electrode layer and the second electrode layer are not in contact with each other, and
both end edges of the organic layer in the longitudinal direction of the substrate are covered by both end sides of the second electrode layer in the longitudinal direction, on at least both outer sides of the light emitting part in the longitudinal direction of the substrate, with a configuration where the organic layer protrudes from the first electrode layer toward at least both outer sides in a longitudinal direction of the substrate, and the second electrode layer also protrudes from the organic layer toward at least both outer sides in the longitudinal direction.

4. The organic EL device according to claim 3, wherein
the substrate has a surface roughness in the longitudinal direction that is smaller than a surface roughness in the lateral direction.

* * * * *